United States Patent
Offrein et al.

(10) Patent No.: US 12,364,172 B2
(45) Date of Patent: Jul. 15, 2025

(54) ELECTRICAL MEMRISTIVE DEVICES BASED ON BILAYER ARRANGEMENTS OF $HfO_y$ AND $WO_x$

(71) Applicant: International Business Machines Corporation, Armonk, NY (US)

(72) Inventors: Bert Jan Offrein, Schoenenberg (CH); Valeria Bragaglia, Thalwil (CH); Folkert Horst, Wettingen (CH); Antonio La Porta, Kilchberg (CH); Roger F. Dangel, Zug (CH); Daniel S. Jubin, Langnau am Albis (CH)

(73) Assignee: International Business Machines Corporation, Armonk, NY (US)

( * ) Notice: Subject to any disclaimer, the term of this patent is extended or adjusted under 35 U.S.C. 154(b) by 656 days.

(21) Appl. No.: 17/189,173

(22) Filed: Mar. 1, 2021

(65) Prior Publication Data
US 2022/0278274 A1 Sep. 1, 2022

(51) Int. Cl.
*H10N 70/00* (2023.01)
*G06N 3/065* (2023.01)
*H10B 63/00* (2023.01)

(52) U.S. Cl.
CPC .......... *H10N 70/841* (2023.02); *G06N 3/065* (2023.01); *H10B 63/84* (2023.02); *H10N 70/023* (2023.02); *H10N 70/8833* (2023.02)

(58) Field of Classification Search
CPC ............. H10N 70/826; H10N 70/8833; H10N 70/021; H10B 63/84; G06N 3/063
See application file for complete search history.

(56) References Cited

U.S. PATENT DOCUMENTS

| 7,060,586 B2 | 6/2006 | Li |
| 8,779,409 B2 | 7/2014 | Yang et al. |

(Continued)

FOREIGN PATENT DOCUMENTS

| CN | 108963072 | 12/2018 |
| JP | 2003-332529 A | 11/2003 |

(Continued)

OTHER PUBLICATIONS

National IP Admin. of the PRC as ISA, ISR and Written Opinion, related PCT application PCT/IB2022/051532, Authorized Officer Jiangang Wu, 6 pages total.

(Continued)

*Primary Examiner* — Mark V Prenty
(74) *Attorney, Agent, or Firm* — Kimberly Zillig; Otterstedt & Kammer PLLC

(57) ABSTRACT

An electrical memristive device has a layer structure. The layer structure comprises two electrodes and a bilayer material arrangement that connects the two electrodes. The bilayer material arrangement may, for example, be sandwiched by the two electrodes, in direct contact therewith. The bilayer material arrangement includes an $HfO_y$ layer, where $1.3\pm 0.1 \leq y < 1.9\pm 0.1$, as well as a $WO_x$ layer in direct contact with the $HfO_y$ layer, where $2.5\pm 0.1 \leq x < 2.9\pm 0.1$. The bilayer arrangement involves sub-stoichiometric layers of $HfO_y$ and $WO_x$, where the $WO_x$ layer may advantageously have a polycrystalline structure in the monoclinic phase, while the $HfO_y$ layer is preferably amorphous.

19 Claims, 4 Drawing Sheets

(56) References Cited

U.S. PATENT DOCUMENTS

| | | | |
|---|---|---|---|
| 8,816,317 | B2 | 8/2014 | Gorer |
| 8,891,284 | B2 | 11/2014 | Williams et al. |
| 9,887,351 | B1 | 2/2018 | Ando et al. |
| 10,158,068 | B1 | 12/2018 | Lee |
| 10,312,441 | B1 | 6/2019 | Fompeyrine et al. |
| 10,516,108 | B2 | 12/2019 | Fompeyrine et al. |
| 10,803,396 | B2 | 10/2020 | Yoscovits |
| 11,910,621 | B2 * | 2/2024 | Wu ............... H10N 70/066 |
| 2010/0021626 | A1 | 1/2010 | Hsieh et al. |
| 2010/0258778 | A1 * | 10/2010 | Sung ............. H10N 70/026 257/43 |
| 2014/0145142 | A1 | 5/2014 | Zhang |
| 2015/0255512 | A1 | 9/2015 | Takagi et al. |
| 2017/0271404 | A1 | 9/2017 | Ho et al. |
| 2018/0287059 | A1 | 10/2018 | Ando |
| 2020/0102450 | A1 | 4/2020 | Lee |
| 2020/0273910 | A1 | 8/2020 | Wu |
| 2022/0278274 | A1 * | 9/2022 | Offrein ........... H10N 70/8833 |

FOREIGN PATENT DOCUMENTS

| | | |
|---|---|---|
| JP | 2007-258533 A | 10/2007 |
| JP | 2011-040613 A | 2/2011 |
| JP | 2014-175419 A | 9/2014 |
| JP | 2018-049887 A | 3/2018 |
| JP | 2019-054171 A | 4/2019 |
| JP | 2020-057278 A | 4/2020 |
| KR | 10-2010-0113300 A | 10/2010 |
| WO | 2015/125449 A1 | 8/2015 |
| WO | 2016105407 A1 | 6/2016 |

OTHER PUBLICATIONS

Multibit Memory Operation of Metal-Oxide Bi-Layer Memristors, Scientific Reports, 2017. pp. 8.

Somsubhra Chakrabarti et al. Temperature-Dependent Non-linear Resistive Switching Characteristics and Mechanism Using a New W/WO3/WOx/W Structure. Nono Express, 2016. pp. 8.

V.Bragaglia et al. WO3/HfO2 based resistive devices for neuromorphic computing, Presented at MEMRISYS 2019 Dresden, Germany Jul. 8-11, 2019, 1 page.

German Patent and Trademark Office, examination notice of Apr. 29, 2024, 10 pages total, Counterpart German Patent Application File No. 11 2022 001 334.6.

7 pages total, Machinery translation Depatis of Apr. 28, 2024 of the publication CN 108963072 A as cited in German Patent and Trademark Office, examination notice of Apr. 29, 2024, 10 pages total, Counterpart German Patent Application File No. 11 2022 001 334.6, CN 108963072 A original document has already been cited and considered.

Acharya et al. "Epitaxial Brownmillerite Oxide Thin Films for Reliable Switching Memory", ACS Applied Materials & Interfaces, Mar. 9, 2016, pp. 7902-7911, vol. 8, Issue 12.

Beck et al. "Reproducible switching effect in thin oxide films for memory applications", Applied Physics Letters, Jul. 3, 2000, 139-141, vol. 77, Issue 1, https://doi.org/10.1063/1.126902.

Berak et al., "Effect of oxygen-deficiency on electrical transport properties of tungsten trioxide crystals", Journal of Solid-State Chemistry, Jun. 1970, pp. 109-133, vol. 2, Issue 1.

Chang et al. "Synaptic behaviors and modeling of a metal oxide memristive device", Applied Physics A, Jan. 2010, pp. 857-863, vol. 102.

Chien et al. "A study of the switching mechanism and electrode material of fully CMOS compatible tungsten oxide ReRAM", Applied Physics A, Jan. 26, 2011, pp. 901-907, vol. 102.

Dirkmann et al. "The role of ion transport phenomena in memristive double barrier devices", Scientific Reports, Oct. 20, 2016, 12 pages.

Gillet et al. "The role of surface oxygen vacancies upon WO3 conductivity", Surface Science, Jun. 10, 2003, pp. 519-525, vols. 532-535.

Gokmen et al. "Acceleration of Deep Neural Network Training with Resistive Cross-Point Devices: Design Considerations", Frontiers in Neuroscience, Jul. 21, 2016, 19 pages, vol. 10.

Hansen et al. "A double barrier memristive device", Scientific Reports, Sep. 8, 2015, 12 pages.

Intellectual Property Office, "Office action," Oct. 30, 2024, 22 Pages, KR Application No. 10-2023-7027330.

Jo et al. "Nanoscale memristor device as synapse in neuromorphic systems", Nano Letters, Apr. 14, 2010, pp. 1297-1301, vol. 10, Issue No. 4.

Lelmini et al. "In-Memory Computing with Resistive Switching Devices", Nature Electronics, Jun. 13, 2018, pp. 333-343, vol. 1.

Tambunan et al. "Resistance switching in epitaxial SrCoOx thin films", Applied Physics Letters, Aug. 14, 2014, 063507 (6 pages), vol. 105, Issue 6.

Waser et al. "Redox-Based Resistive Switching Memories—Nanoionic Mechanisms, Prospects, and Challenges", Advanced Materials, Jul. 13, 2009, 2632-2663, vol. 21, Issue No. 25-26.

Yang et al. "Memristive devices for computing", Nature Nanotechnology, Dec. 27, 2012, pp. 13-24, vol. 8.

Intellectual Property Office, "Notice of Allowance," Apr. 18, 2025, 10 Pages, KR Application No. 10-2023-7027330.

Japan Patent Office, "Notice of Reasons For Refusal" Apr. 18, 2025, 11 Pages, JP Application No. 2023-540887.

* cited by examiner

ELECTRICAL MEMRISTIVE DEVICES BASED ON BILAYER ARRANGEMENTS OF $HfO_y$ AND $WO_x$

BACKGROUND

The invention relates in general to the field of electrical memristive devices and apparatuses comprising such devices, notably artificial neural network hardware apparatuses, as well as methods of fabrication of such devices. In particular, the invention is directed to electrical memristive devices comprising a bilayer arrangement of sub-stoichiometric layers of $HfO_y$ and $WO_x$, where the $WO_x$ layer has a polycrystalline structure in the monoclinic phase.

Machine learning often relies on artificial neural networks (ANNs), which are computational models inspired by biological neural networks in human or animal brains. An ANN comprises a set of connected units or nodes, called artificial neurons. Signals are transmitted along connections (also called edges) between artificial neurons, similarly to synapses. That is, an artificial neuron that receives a signal processes it and then signals connected neurons. Connection weights (also called synaptic weights) are associated with the connections and nodes. Each neuron may have several inputs and a connection weight is attributed to each input (the weight of that specific connection). Such weights adjust as learning proceeds.

Many types of neural networks are known, starting with feedforward neural networks, such as multilayer perceptrons, deep neural networks and convolutional neural networks. Besides, new types of neural networks emerge, such as spiking neural networks. Neural networks are typically implemented in software. However, a neural network may also be implemented in hardware (e.g., as a crossbar array structure for performing the synaptic interconnect operation), processing electrical or optical signals. I.e., a hardware-implemented ANN is a physical machine that clearly differs from a classic computer (general- or specific-purpose computer) in that it is primarily and specifically designed to implement an ANN (for training and/or inference purposes).

Running matrix operations (notably for back-propagation ANN algorithms) on crossbar arrays of memristors may potentially improve performance and efficiency of the hardware-implemented ANNs compared to software-implemented ANNs. The properties of the synaptic elements are key to the performance of the hardware-implemented ANN.

Synaptic elements used in neuromorphic hardware apparatuses typically comprise a memristive device, e.g., a phase-change memory (PCM) device, a resistive random-access memory (RRAM), or a magnetic random-access memory (SRAM). A memristor is a non-linear, two-terminal electrical component, which regulates the flow of electrical current and remembers its conductive state. Furthermore, the resistance of a memristor depends on the history of electric signals applied though the device. A memristor is non-volatile, insofar as it retains memory without power and does not change its state for small electrical signals when reading operation is performed at lower biases (V<0.3V).

Memristive devices are typically embodied as nanoscale memory devices. Recent advances in such memory devices are making this technology ever more relevant to industrial applications. For example, memristive devices can be used as building blocks of new computing paradigms, such as brain-inspired computing and memcomputing. In particular, and as noted above, such devices can be used in hardware implemented ANNs, such as crossbar array structures of resistive processing units. However, there are key challenges to overcome, such as the high programming power required, noise, and resistance drift of the memristors.

SUMMARY

According to a first aspect, the present invention is embodied as an electrical memristive device (or memristor) having a layer structure. The layer structure comprises two electrodes and a bilayer material arrangement that connects the two electrodes. The bilayer material arrangement may for example be sandwiched by the two electrodes, in direct contact therewith. The bilayer material arrangement includes an $HfO_y$ layer, where $1.3\pm0.1 \leq y < 1.9\pm0.1$, as well as a $WO_x$ layer in direct contact with the $HfO_y$ layer, where $2.5\pm0.1 \leq x < 2.9\pm0.1$. In other words, the bilayer arrangement of the $HfO_y$ and $WO_x$ layers involves sub-stoichiometric layers of $HfO_2$ and $WO_3$, which happens to favorably impact properties of the memristor.

In preferred embodiments, the $WO_x$ layer has a polycrystalline structure in the monoclinic phase, where average dimensions of grains of the $WO_x$ layer are larger than or equal to 10 nm in an average plane of the bilayer material arrangement and larger than or equal to 20 nm in the perpendicular direction. The $HfO_y$ layer is preferably amorphous.

According to another aspect, the invention is embodied as an apparatus comprising a plurality of electrical memristive devices such as described above. The apparatus further includes an input circuit connected to the electrical memristive devices, so as to be able to operate the latter, in operation. The apparatus further includes a readout circuit, which is connected to the devices. The readout circuit is configured to sense electrical signals impacted by electrical conductances of the electrical memristive devices, in operation.

The apparatus is preferably configured as an artificial neural network hardware, where the memristive devices act as synaptic elements. The apparatus includes a crossbar array structure with input lines and output lines, where the input lines and the output lines are interconnected at junctions, each including one of the electrical memristive devices.

According to a final aspect, the invention is embodied as a method of fabricating an electrical memristive device. The method comprises providing a substrate and successively obtaining: a first electrode extending on top of the substrate, in electrical contact therewith; an $HfO_y$ layer extending on top of the first electrode, in electrical communication therewith; a $WO_x$ layer in direct contact with the $HfO_y$ layer; and a second electrode extending on top of the $WO_x$ layer, so as for the second electrode to be in electrical communication with the $WO_x$ layer. Consistently with the first aspect of the invention, the indices x and y obey the following constraints: $2.5\pm0.1 \leq x < 2.9\pm0.1$ and $1.3\pm0.1 \leq y < 1.9\pm0.1$.

Preferably, each of the first electrode layer and the $HfO_y$ layer is obtained by atomic layer deposition. The $HfO_y$ layer is deposited subsequently to the first electrode layer, without exposing the first electrode layer to air. In addition, the $WO_x$ layer is preferably obtained by: sputtering tungsten in vacuum to obtain a layer of tungsten; oxidizing the tungsten layer at a temperature that is between 300 C and 450 C to obtain a $WO_3$ layer; and reducing the $WO_3$ layer obtained to obtain the $WO_x$ layer.

BRIEF DESCRIPTION OF THE DRAWINGS

These and other objects, features, and advantages of the present invention will become apparent from the following detailed description of illustrative embodiments thereof, which is to be read in connection with the accompanying drawings. The illustrations are for clarity in facilitating one skilled in the art in understanding the invention in conjunction with the detailed description. In the drawings.

Figure 1:
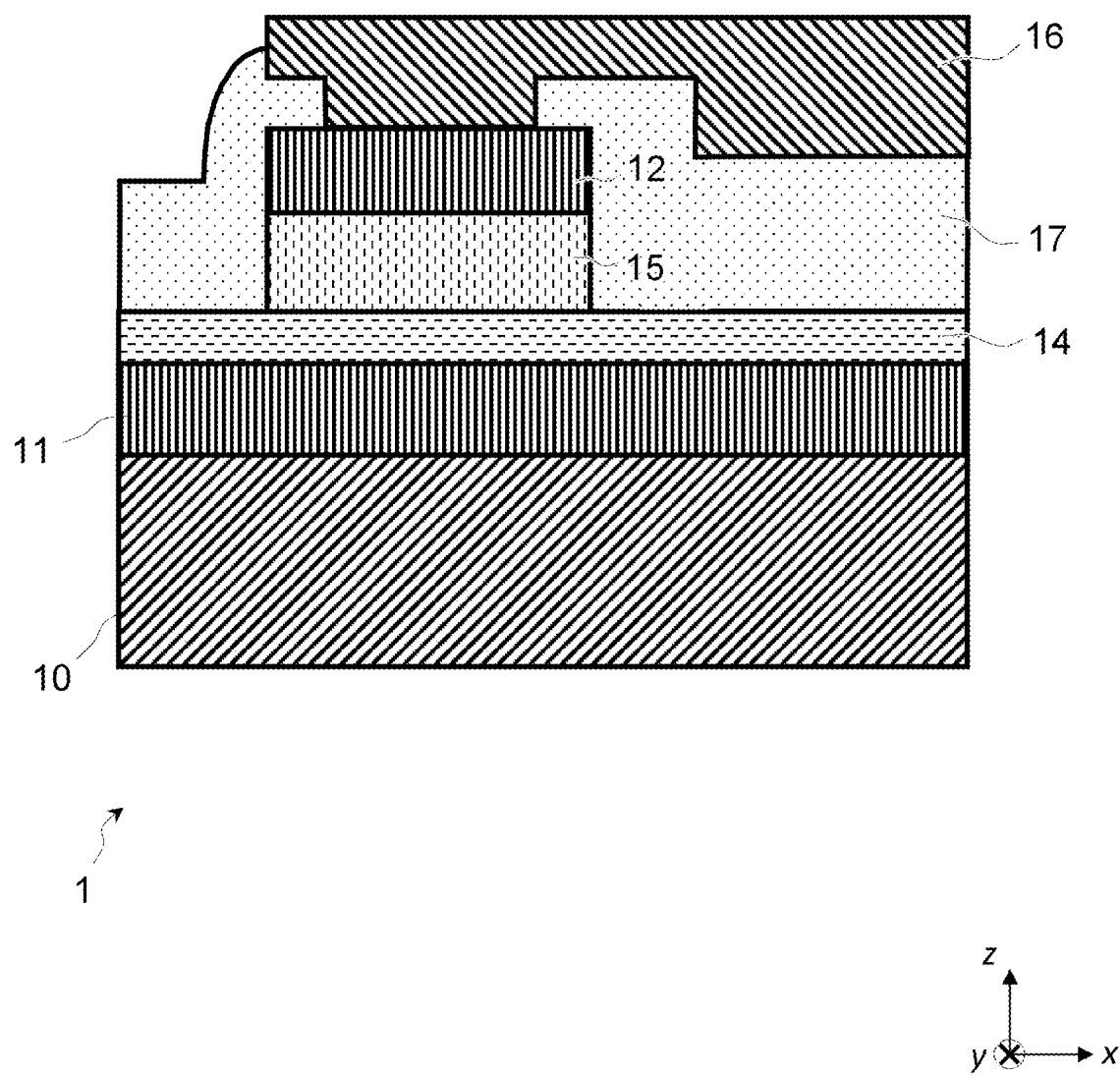
FIG. 1 is a 2D cross-sectional view of a 2-terminal electrical memristive device in a vertical configuration, according to first embodiments.

The accompanying drawings show simplified representations of devices and apparatuses, or parts thereof, as involved in embodiments. Technical features depicted in the drawings are not necessarily to scale. Similar or functionally similar elements in the figures have been allocated the same numeral references, unless otherwise indicated.

Devices, apparatuses, and fabrication methods embodying the present invention will now be described, by way of non-limiting examples.

DETAILED DESCRIPTION OF EMBODIMENTS OF THE INVENTION

The present fabrication method and its variants are collectively referred to as the "present methods". All references Sn refer to fabrication steps of the flowchart of FIG. 4, while numeral references pertain to physical parts or components of a device or an apparatus such as shown in FIGS. 1 to 3.

Figure 2:
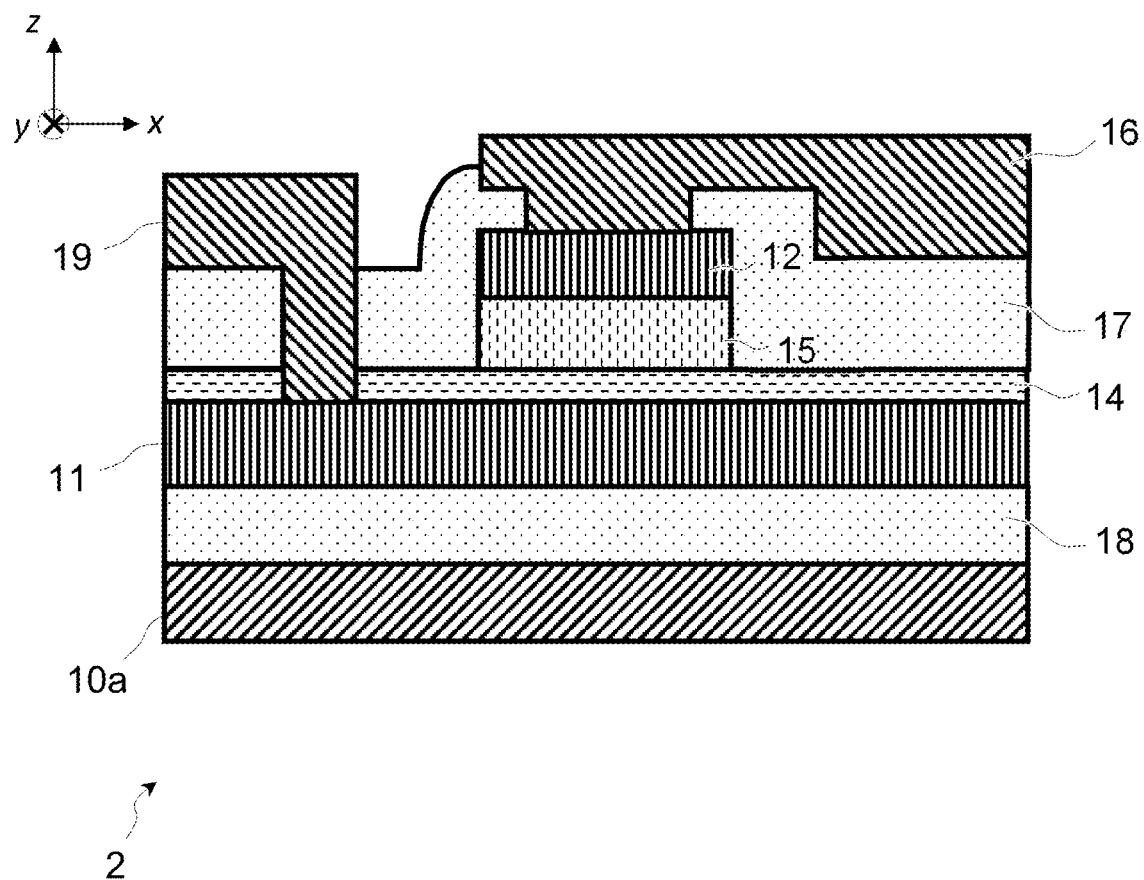
FIG. 2 is a 2D cross-sectional view of a 2-terminal electrical memristive device in a planar configuration, according to second embodiments.
Figure 3:
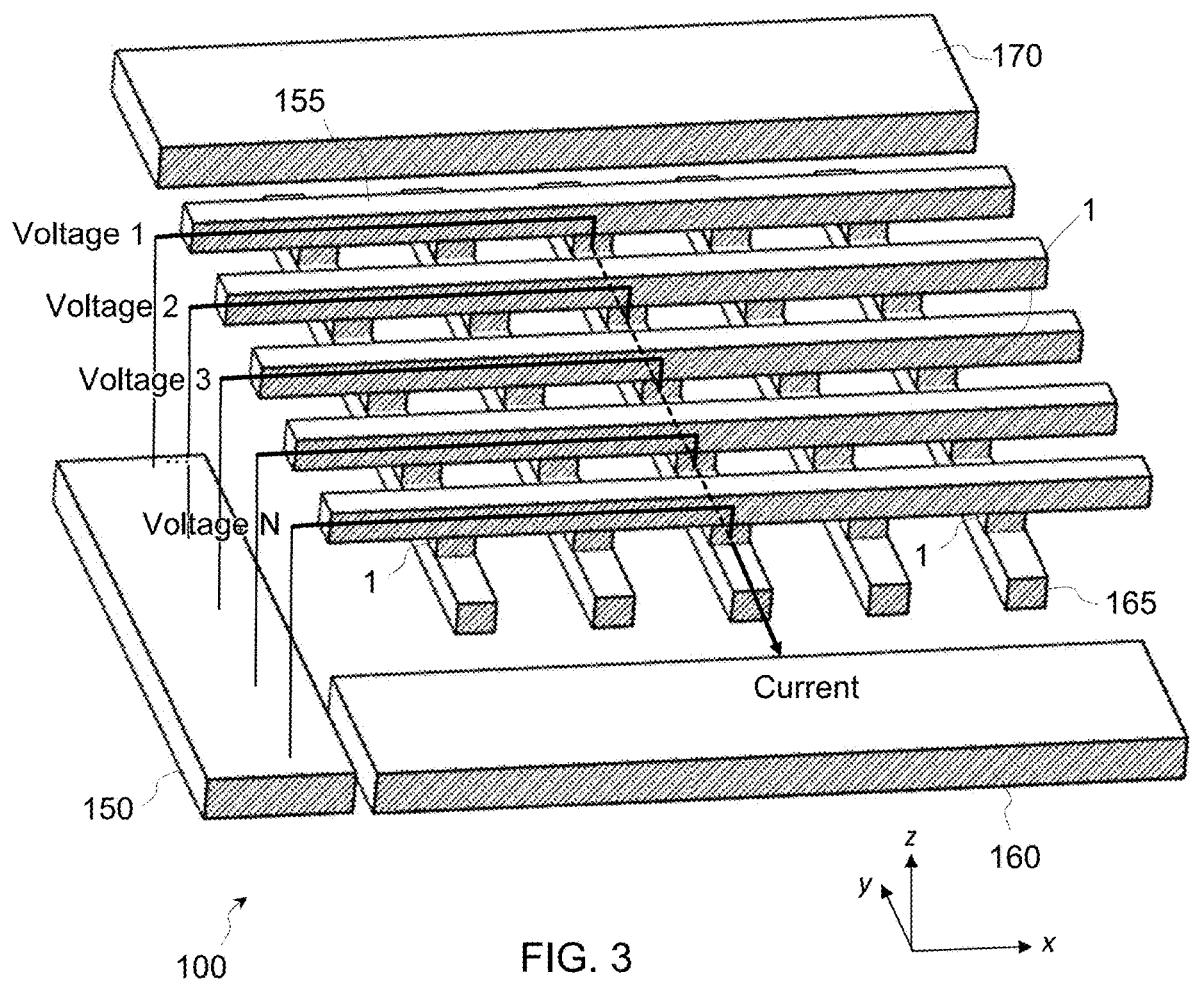
FIG. 3 is a 3D view of components of an apparatus configured as an artificial neural network hardware having a crossbar array structure with junctions including devices such as shown in FIG. 1, as in embodiments.

In reference to FIGS. 1 and 2, an aspect of the invention is first described, which concerns an electrical memristive device 1, 2, or memristor. Basically, the device 1, 2 has a layer structure, i.e., a stack of nanoscale layers of materials. The stack notably includes two electrodes 11, 12, which are formed as layers or layer portions. In addition, the layer structure includes a bilayer material arrangement that electrically connects the two electrodes. The bilayer arrangement includes an $HfO_y$ layer 14 and a $WO_x$ layer 15, where the latter is in direct contact with the former. Importantly, each of the $HfO_y$ layer and the $WO_x$ layer is a sub-stoichiometric layer.

Namely, $1.3\pm0.1 \leq y < 1.9\pm0.1$ and $2.5\pm0.1 \leq x < 2.9\pm0.1$. For example, the bilayer arrangement may involve layers where $1.5\pm0.1 \leq y < 1.7\pm0.1$ and $2.6\pm0.1 \leq x < 2.8\pm0.1$. The precision, 0.1, is given by the last digit. In other words, x is strictly less than 3, whereas y is strictly less than 2, i.e., values corresponding to the expected stoichiometry of the layers.

X-ray photoemission spectroscopy, complemented by energy-dispersive X-ray spectroscopy (EDX), and transmission electron microscope (TEM) analyses, can be used to characterize the degree of sub-stoichiometry ($x < 2.9\pm0.1$ and $y < 1.9\pm0.1$). As the present inventors have realized, the resulting devices appear to have markedly improved properties, especially for use as memories or as synaptic elements of hardware implemented artificial neural networks (ANNs). In particular, memristive devices based on sub-stoichiometric $WO_x/HfO_y$ bilayer arrangements as described above allow an improved performance to be obtained, be it in terms of analog resistance change, noise, or suppressed stochasticity of SET operations.

The actual reasons for such improvements remain partly unclear. The physical mechanisms involved are related to oxygen exchanges between the $WO_x$ layer 15 and the conductive filaments formed in the $HfO_y$ layer 14. Complex phenomena are at work, which concern interface oxygen exchanges, drift through grain boundaries, defects, and valence change in the $WO_x$ layer. The $WO_x$ layer acts as a good ion conductor and has suitable non-volatile resistive switching characteristics.

The layer stack can be fairly easily fabricated using atomic layer deposition, sputtering, and rapid thermal oxidation annealing, as discussed later in reference to another aspect of the invention.

The present memristive devices can notably be used as resistive random-access memory (RRAM) devices. Compared to typical $Ti/HfO_2$ RRAM devices, the present devices result in more gradual transitions between the high resistance state (HRS) and the low resistance state (LRS). In addition, the present devices 1, 2 give rise to more tunable states (HRS and LRS) upon applying the programming signals (e.g., pulses of voltage biases). Moreover, no major drift <0.2% is observed for the different programmed states.

The operation of such devices is very simple. The devices are amenable to integration in hardware. In particular, the present devices 1, 2 can advantageously be used as synaptic elements in neuromorphic circuitry, so as to store and modify weights of synaptic elements in crossbar array structures.

All this is now described in detail, in reference to particular embodiments of the invention. To start with, the $WO_x$ layer 15 preferably has a polycrystalline structure in the monoclinic phase. Such a polycrystalline arrangement was confirmed by TEM analyses. The polycrystalline structure gives rise to grain boundaries. Such grains, and their dimensions, are currently believed to play an important role in (and favorably contribute to) the properties of the present devices.

As seen in FIGS. 1 and 2, the $HfO_y$ layer 14 and the $WO_x$ layer 15 are stacked along a stacking direction z, i.e., the direction perpendicular to the average plane of the bilayer material arrangement. In preferred embodiments, the polycrystalline $WO_x$ layer 15 is processed in such a manner that the average dimensions of the grains of the $WO_x$ layer 15 are larger than or equal to 20 nm along said stacking direction, while also being larger than or equal to 10 nm in the average plane of the bilayer material arrangement. The grain sizes are easily measured from, e.g., TEM images. The scale (integrated in the TEM image) can be used to measure the size of the grains. The same can be repeated for several TEM images (TEM is a local characterization technique).

A polycrystalline material 15 such as described above makes it possible for the $WO_x$ layer 15 to have an electrical resistivity p that is between $10^{-2}$ and $10^2$ ohm-cm ($\Omega \cdot cm$). That is, the resistivity of this layer may vary up to four orders of magnitude, which is appropriate for switching the device between an FIRS and an LRS, as in applications discussed later. Note, the resistivity can notably be measured from Hall measurements, e.g., using the van der Pauw Method.

As opposed to the $WO_x$ layer 15, which has a polycrystalline structure, the $HfO_y$ layer 14 is preferably fabricated so as to be amorphous. This was confirmed by X-ray diffraction analyses; the X-Ray spectrum does not show any substantial diffraction peak. Moreover, no crystalline grains could be seen on TEM images in that case. Relying on an amorphous $HfO_y$ layer 14 appears to favorably impact the performance of the device 1, 2 in terms of both stability and endurance.

In variants, a crystalline HfO layer can be used, although it is likely more difficult to obtain.

In embodiments, the electrodes 11, 12 are made of an inert metal. Such electrodes are preferably formed as layers or layer portions, as assumed in FIGS. 1 and 2. For example, each of the two electrodes 11, 12 may include or essentially consist of one or more metals such as Pt, W, and TiN. An inert metal refers to a metal that is not chemically active as opposed to metals such as aluminum.

Each of the devices 1, 2 shown in FIGS. 1 and 2 involve two electrodes 11, 12, where the first electrode 11 is formed as a layer and the second electrode 12 is formed as a layer portion. Each of the two electrodes is in direct contact with the bilayer arrangement, on opposite sides thereof. The first electrode 11 is in direct contact with the HfO$_y$ layer 14 (below the latter), while the second electrode 12 is in direct contact with the WO$_x$ layer 15, above the layer 15. That is, the electrode layers 14, 15 sandwich the bilayer arrangement 14, 15.

The devices 1, 2 shown in FIGS. 1, 2 further comprise a substrate 10, 10a, which supports the first electrode 11. The substrate 10, 10a provides mechanical stability to the device 1, 2 and may additionally serve to ground the device 1 (via the electrode layer 11, as assumed in FIG. 1). The devices 1, 2 further include an electrical contact 16, which is in electrical communication with the second electrode 12. In the examples of FIGS. 1, 2, the electrical contact 16 is patterned on top of the electrode 12. Moreover, an electrically insulating layer 17 embeds the second electrode 12.

For example, each of the two electrodes 11, 12 may comprise TiN, which is a very reactive material. However, these electrodes 11, 12 are protected by the neighboring materials, which cover or embed the electrodes. That is, the first electrodes 11 is coated by the substrate 10 (FIG. 1) or an insulating layer 18 (FIG. 2) on one side and by the HfO$_y$ layer 14 on the opposite side. Similarly, the second electrode 12 is coated by the WO$_x$ layer 15 on one side and by the top electrical contact 16 and the insulating material 17 on the opposite side (FIGS. 1 and 2).

Figure 4:
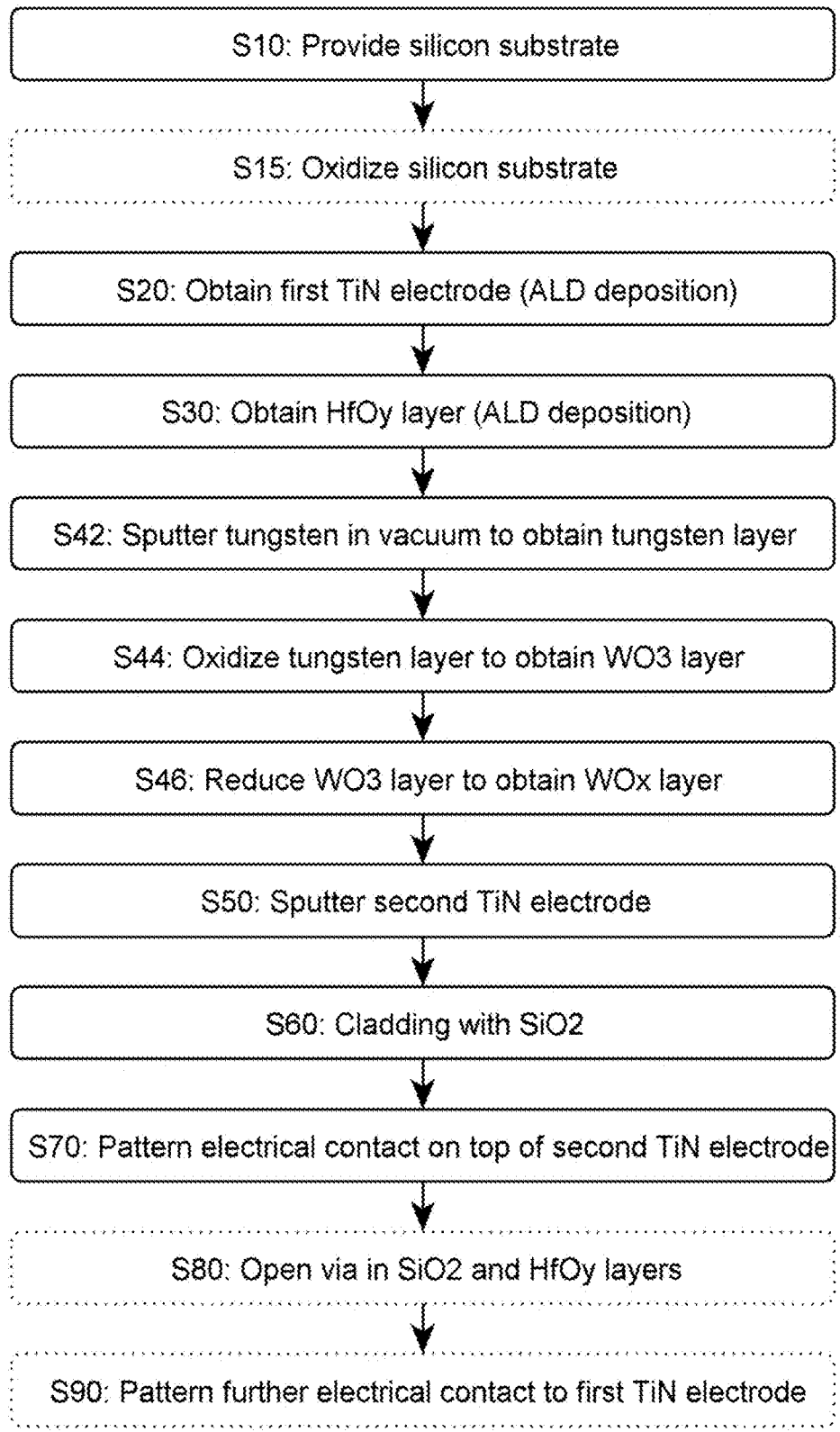
FIG. 4 is a flowchart illustrating high-level fabrication steps of electrical memristive devices, according to embodiments.

The electrically insulating layers 17, 18 typically comprise or consist of SiO$_2$, as assumed in the flow of FIG. 4. The electrical contact 16 (on top) partly coats the top electrode 12, which is otherwise embedded in the SiO$_2$ layer 17, to prevent undesired oxidization of this electrode 12. In variants, the electrically insulating layers 17, 18 may comprise another material, such as SiN.

The substrate 10 may for instance comprise highly doped silicon (as assumed in FIG. 1), such that electrical contact to the second electrode may be ensured via the doped silicon substrate) in that case. The electrical signals applied flow from the top electrical contact 16 (e.g., made of tungsten) to the substrate 10. Electrical conductance values may be read in output of the device (via the electrode 12 and the substrate 10).

In variants, the device may be configured as a planar device 2, as illustrated in FIG. 2. In this case, the substrate 10a may include or essentially consist of silicon. Yet, an additional insulating layer 18 is provided on top of the substrate 10a, e.g., by oxidizing the later. As in FIG. 1, an electrical contact 16 is patterned on top of the second electrode 12 (e.g., TiN), which is otherwise immersed in SiO$_2$ 17. The device 2 further comprises an additional electrical contact 19, which ensures electrical communication with the first electrode 11. A via is formed through the electrically insulating layer 17 and the HfO$_y$ layer 14, so as for the electrical contact 19 to reach the first electrode 11.

The contact 19 otherwise extends opposite to the substrate 10 with respect to the second electrode 12, so as to be contacted from the top.

The present devices 1, 2 are typically fabricated as nanoscale devices. The thickness of the WO$_x$ layer 15 is preferably between 10 nm and 100 nm. In preferred embodiments, the thickness of the HfO$_y$ layer 14 is between 3 nm and 10 nm, while the thickness of each of the two electrodes 11, 12 is preferably between 10 nm and 100 nm. Still, one or each of the electrode layers 11, 12 may be made thicker, this depending of the fabrication process used and the intended application. The thicknesses of the layers 11, 12, 14, 15 are measured along the stacking direction z in the accompanying drawings. The lateral dimensions of the devices are typically larger than 20 nm; lateral dimensions are measured in directions parallel to the (x, y) plane in the accompanying drawings. The above thicknesses have been determined by EDX and confirmed by TEM analyses, as well as X-ray reflectivity measurements. Such dimensions are amenable to easy integration in apparatuses as described below.

Referring to the flowchart of FIG. 4, another aspect of the invention is now described, which concerns a method of fabrication of an electrical memristive device 1, 2 such as described above.

First, a substrate 10, 10a is provided, step S10. Next, various layers 11, 14, 15, 12 are successively obtained S20-S50, as explained below.

A first electrode 11 is obtained (step S20), e.g., as a layer, which extends on top of the substrate 10, 10a, in electrical contact therewith. This layer 11 may possibly be in direct contact with the substrate 10, as assumed in FIG. 1. Else, an intermediate oxide layer 18 may be formed (step S15) on the substrate 10a, as in FIG. 2.

Next, an HfO$_y$ layer 14 is obtained, which extends on top of the first electrode 11 and in electrical communication therewith. As noted earlier, 1.3±0.1≤y<1.9±0.1. The HfO$_y$ layer 14 is preferably in direct contact with the electrode 11. Then, a WO$_x$ layer 15 is obtained, where 2.5±0.1≤x<2.9±0.1. The layer 15 must be in direct contact with the HfO$_y$ layer 14, to enable oxygen exchanges as evoked earlier. The second electrode 12 is subsequently formed, e.g., as a layer portion. The electrode 12 extends on top of the WO$_x$ layer 15, and so as for the second electrode 12 to be in electrical communication with the WO$_x$ layer 15. The WO$_x$ layer 15 is normally in direct contact with the electrode 12, as assumed in FIGS. 1, 2.

In preferred embodiments, each of the first electrode layer 11 and the HfO$_y$ layer 14 is obtained S20, S30 by atomic layer deposition (ALD). The HfO$_y$ layer is deposited S30 subsequently to the first electrode layer 11, e.g., immediately after, without exposing the first electrode layer 11 to air. The aim is to prevent oxidization of the first electrode 11, which preferably comprises TiN, as noted earlier. The resulting HfO$_y$ layer 14 is normally amorphous and quasi-insulating, i.e., a small leakage current occurs across the layer for any applied (non-zero) voltage bias.

The WO$_x$ layer 15 is preferably obtained via a three-step process S42-S46, as discussed below. First, tungsten is sputtered (step S42) in vacuum, which results in forming a layer of tungsten. Next, the layer of tungsten is oxidized (step S44) at a temperature of at least 300 C. This results in a WO$_3$ layer. For instance, in particularly preferred embodiments, step S42 is performed so as to achieve a layer of tungsten that has a thickness of 7 nm. The temperature and the duration for subsequently oxidizing S44 the layer of tungsten are chosen so as to obtain a WO$_3$ layer having a thickness of 23 nm. The $WO_3$ layer obtained upon completing step S44 is subsequently reduced (step S46) to obtain the $WO_x$ layer 15, where x<3.

The oxidation step S44 is normally realized under an $O_2$ atmosphere, in an oven, at a controlled temperature and during a controlled time. The subsequent reduction S46 can be realized in the same oven. The $WO_3$ layer is preferably reduced S46 in a gas comprising Ar (or N) and $H_2$. The process can be controlled so as to obtain a polycrystalline $WO_x$ layer in the monoclinic phase, with average dimensions of grains as discussed earlier. To that aim, the temperature at which step S44 is performed can be chosen as the temperature of crystallization of the $WO_3$ layer, so as to obtain a polycrystalline, monoclinic $WO_3$ layer. Such crystallization temperatures are, depending on the film thickness and annealing time durations, typically between 300 and 600 C. However, the temperature applied in the present context is preferably between 300 C and 450 C, so as for the process to remain CMOS-compatible. In variants, the $WO_x$ layer can be obtained by ALD or other known deposition techniques.

Like the first electrode, the second electrode 12 may for instance be obtained S50 as a TiN electrode (or another inert metal), which is most conveniently achieved by sputtering. And, as noted earlier too, the TiN electrode is preferably cladded S60 with an insulating material 17, e.g., $SiO_2$. If necessary, a trench may then be opened in the insulating material 17, so as to allow insertion of an electrical contact 16, for it to reach the top electrode 12. This electrical contact 16 is obtained by sputter deposition at step S70, so as to be in direct contact with the TiN electrode. The contact 16 may further be patterned, if necessary, using standard processing techniques.

The above embodiments of the present fabrication method have been succinctly described. I.e., only the high-level fabrication steps are described. However, the above steps may have to be complemented by usual lithographic steps, to precisely structure the layers, as usual in the art.

A preferred fabrication flow is shown in FIG. 4. First, a highly doped (n-doped) silicon substrate 10 is provided, step S10. ALD processes are then used to first deposit the TiN electrode 11 (step S20) and then the $HfO_y$ layer 14 (step S30). The $HfO_y$ layer is deposited immediately after depositing the TiN electrode, without exposing TiN to air, to prevent oxidation thereof. Next, a 7 nm tungsten layer is obtained S42 by sputtering in vacuum (no oxygen should be present). The tungsten layer is then oxidized S44 at high temperature (i.e., between 300 C and 450 C, for example at 350 C, which is still CMOS-compatible). The tungsten layer is transformed into a 23 nm thick layer of $WO_3$ by judiciously controlling the duration and the temperature used at step S44. As noted earlier, the oxidation S44 is preferably performed at the temperature of crystallization of the $WO_3$ layer, to obtain a polycrystalline monoclinic $WO_3$. This layer is subsequently reduced S46 in a gas of $Ar+H_2$ to obtain a sub-stoichiometric $WO_x$ layer with grain sizes as discussed earlier. Next, another TiN electrode 12 is obtained S50 by sputtering on top of the $WO_x$ layer 15. The electrode 12 is then embedded in a $SiO_2$ cladding 17 at step S60. The insulating layer 17 may for instance be obtained by plasma-enhanced chemical vapor deposition (PECVD). The cladding 17 may then be further processed, e.g., by physical and/or chemical polishing, if needed. As said, SiN may be used in place of $SiO_2$. A trench may further be opened, if necessary. A sputter deposition of the top electrical contact 16 of tungsten subsequently takes place S70. The top electrical contact 16 may further be patterned, as necessary to obtain a suitable electrical contact pad 16.

The fabrication process of planar devices 2 (such as shown as in FIG. 2) is essentially similar to the process used to fabricate a vertical device 1 as shown in FIG. 1, though additional steps S15, S80, S90 are required, as denoted by dotted frames in FIG. 4. Namely, one starts S10 with a silicon substrate 10a, which is then oxidized S15 to obtain a $SiO_2$ layer 18 on top of the silicon substrate 10a. Eventually, a via is opened S80 in the $HfO_y$ layer 14 and the $SiO_2$ layer 18 underneath, to allow the bottom electrode 11 to be accessed from the top. Finally, a sputter deposition of an additional electrical contact 19 (e.g., of tungsten) is performed at step S90. Like the first contact 16, the second contact 19 may be further processed, so as to obtain a suitable contact pad for connecting the device 2.

Such fabrication processes can easily be inserted in a process for fabricating apparatuses such as described below.

Referring to FIG. 3, a final aspect of the invention is now described, which concerns an apparatus 100. This apparatus comprises a plurality of electrical memristive devices 1, 2 such as described above. In addition, the apparatus further comprises an input circuit 150, which is connected to the electrical memristive devices 1, 2 via suitable electrical connectors 155, so as to be able to operate the devices 1, 2, in operation. Moreover, the apparatus further includes a readout circuit 160, also connected to the devices 1, 2, in output thereof. The readout circuit is configured to sense electrical signals from the devices 1, 2. In operation, such signals are impacted by current electrical conductances of the electrical memristive devices 1, 2. In general, such an apparatus 100 can be used as a memory.

Further components like a controller 170 (i.e., a programming circuit) and a processing unit (not shown) may be needed, for reasons that will become apparent later. Note, in FIG. 3, the input circuit 150, the readout circuit 160, and the controller 170 are typically meant to form part of a same processing core, together with the connecting structure formed by the electrical conductors 155 and 165. In variants, however, the components 150, 160, and 170 may be provided on separate chips, for example.

In embodiments, the apparatus 100 is configured as an ANN hardware, as assumed in FIG. 3. The apparatus 100 has a crossbar array structure, including input lines 155 and output lines 165. The input lines 155 and the output lines 165 are interconnected at junctions, as usual. In the present case, however, each junction includes an electrical memristive device 1 such as described earlier. The electrical memristive devices 1 are thus configured as synaptic elements of the ANN hardware. The device preferably has a vertical configuration (as shown in FIG. 1), to ease connections between the input lines and the output lines.

The operation of an apparatus 100 such as shown in FIG. 3 is known per se. The synaptic update function is the most demanding task in training ANN hardware such as depicted in FIG. 3; it requires performant synaptic elements. Numerous electronic device concepts have been proposed to emulate synaptic behaviors, notably through non-volatile resistance changes, as also proposed herein. Synaptic devices based on filamentary conduction in nm thick $HfO_y$ layers are promising candidates to represent the synaptic weights. The arrangement in crossbar arrays of such RRAM devices enables analog synaptic signal processing between the ANN layers, where each layer may potentially contain a large number of neurons. $HfO_y$-based RRAM devices are CMOS-compatible and have excellent potential in terms of gradual resistance change, device stability and reliability, power consumption, and scalability. In particular, a tight control of the gradual resistance change is essential for achieving a fine control and reliable change of the RRAM conductance.

In Ti/HfO$_2$ RRAM devices, for instance, the Ti film acts as an oxygen scavenging layer for the HfO$_2$ layer. After the formation of a filament, the interfacial redox reaction is difficult to precisely control by an external electrical stimulus; this results in abrupt programming characteristic of the FIRS and the LRS. A typical DC set/reset behavior of a Ti/HfO$_2$ system show abrupt transitions between the LRS and HRS. A marked improvement can be obtained by replacing the Ti layer with a properly designed, thin WO$_x$ film acting as an oxygen exchange layer with an HfO$_{y,<2}$ film (instead of an HfO$_2$ layer), as proposed herein. The WO$_x$ crystalline matrix acts as a good ion conductor and exhibits suitable, non-volatile resistive switching characteristics. Compared to the Ti/HfO$_2$ RRAM, the RRAM based on a WO$_x$/HfO$_y$ stack results in a more gradual HRS-to-LRS transition and in a more tunable HRS and LRS upon applying the programming voltage pulses. Moreover, no major drift <0.2% is observed for the different programmed states.

In the example of FIG. 3, the crossbar array structure is formed by N input lines 155 and M output lines 165. Only five input lines and five output lines are depicted in this example, for the sake of depiction. In practice, however, hundreds (or thousands) of input lines would likely be involved. Similarly, hundreds (or thousands) of output lines would likely be used. Certain applications may require that N differs from M. The input lines and the output lines are interconnected at the junctions, via N×M electronic devices, which include, each, a memristive device 1 such as described earlier.

The controller 170 may advantageously be an analog circuit. The controller is used to program the devices 1, via the input circuit 150, for the devices 1 to store values or, more exactly, to have properties (e.g., electrical conductance) interpretable as such values. The devices 1 may accordingly be programmed to store synaptic weights. The controller 170 may possibly include the input circuit 150 to couple input signals (e.g., apply voltage biases) into the input lines 155. In variants, a distinct analog circuit 150 (distinct from the controller 170) may be used to couple the input signals into the input lines 155, as assumed in FIG. 3.

The readout circuit 160 is configured to read out M output signals (e.g., electrical currents) obtained from the M output lines 165, in output of the devices 1. The readout is typically carried out according to a multiply-accumulate operation, which takes into account signals (e.g., currents) coupled into each of the input lines 155. As per the multiply-accumulate operations performed, values stored on each of the devices 1 impact the readout. The multiply-accumulate operation typically results in that signals coupled into the input lines are respectively multiplied by values stored on the devices 1 at the junctions.

Note, the architecture shown in FIG. 3 corresponds to a single layer of nodes of an ANN, rather than a multilayer network. This architecture may, in principle, possibly be expanded (or stacked) to achieve several connected layers (hence capable of representing a multilayer network). I.e., several crossbar array structures such as shown in FIG. 3 may possibly be interconnected via a core-to-core communication bus. In variants, the same ANN hardware is used to emulate each ANN layer. Yet, the crossbar array structure can be connected to a processor, e.g., including a digital processing unit, passing all the necessary information to successively execute the required layer operations. Note, each or any of the circuit 150-170 may possibly be embodied as a digital processing units, assuming that suitable convertors are provided to translate the signals. However, it is preferred to rely on analog circuits, for efficiency reasons.

The weights as stored on the devices 1 are constant for inference purposes (they benefit from the stability of the devices 1), whereas they need be iteratively reprogrammed for learning purposes, hence the need of updates, e.g., achieved through a back-propagation algorithm. The computation of the weight updates is normally performed by an external processing unit. The crossbar array structure(s) is used to perform all the basic operations (i.e., matrix vector products for the forward evaluation, products of transposed matrices and error gradient vectors for the backward evaluation, and vector outer products for updating weights), which involve large vector-matrix multiplications. During the learning phase, the controller (e.g., analog circuit) 170 is used to re-program the devices 1, so as to alter synaptic weights stored thereon according to the chosen learning algorithm. A structure 100 such as shown in FIG. 3 can serve for both learning and inference purposes.

For completeness, and beyond neural networks, we note that a crossbar array structure such as shown in FIG. 3 may also be used to perform matrix operations capturing decision tree operations. More generally, the present devices 1, 2 can be used as memory elements or electronic components in a variety of applications. In particular, such devices may possibly be co-integrated on silicon CMOS wafer containing circuitry.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated. For example, other materials than those explicitly mentioned herein may be contemplated, notably for the substrates, the electrodes, and the insulating (dielectric) layers.

What is claimed is:

1. An electrical memristive device having a layer structure comprising:
    two electrodes, and,
    connecting the two electrodes, a bilayer material arrangement including:
        an HfO$_y$ layer, wherein $1.3\pm0.1\leq y<1.9\pm0.1$; and
        a WO$_x$ layer in direct contact with the HfO$_y$ layer, wherein $2.5\pm0.1\leq x<2.9\pm0.1$, and wherein the WO$_x$ layer has a polycrystalline structure in a monoclinic phase.

2. The electrical memristive device according to claim 1, wherein the HfO$_y$ layer and the WO$_x$ layer are stacked along a direction perpendicular to an average plane of the bilayer material arrangement; and the average dimensions of grains of the WO$_x$ layer are larger than or equal to 20 nm along said direction, and larger than or equal to 10 nm in said average plane of the bilayer material arrangement.

3. The electrical memristive device according to claim 2, wherein
the WO$_x$ layer has an electrical resistivity that is between $10^{-2}$ ohm-cm and $10^2$ ohm-cm.

4. The electrical memristive device according to claim 2, wherein
the HfO$_y$ layer is amorphous.

5. The electrical memristive device according to claim 1, wherein
each of the two electrodes comprises one or more of Pt, W, and TiN.

6. The electrical memristive device according to claim 1, wherein
the two electrodes comprise a first electrode and a second electrode, each formed as a layer,
the first electrode is in direct contact with the HfO$_y$ layer, while second electrode is in direct contact with the WO$_x$ layer; and
the electrical memristive device further comprises:
a substrate supporting the first electrode;
an electrical contact in electrical communication with the second electrode; and
an electrically insulating layer embedding the second electrode.

7. The electrical memristive device according to claim 6, wherein
the substrate comprises silicon;
the electrical memristive device further comprises an additional electrical contact in electrical communication with the first electrode, through a via formed in the electrically insulating layer and the HfO$_y$ layer, the additional electrical contact extending opposite to the substrate with respect to the second electrode.

8. The electrical memristive device according to claim 1, wherein
a thickness of the WO$_x$ layer is between 10 nm and 100 nm.

9. The electrical memristive device according to claim 8, wherein
a thickness of the HfO$_y$ layer is between 3 nm and 10 nm.

10. The electrical memristive device according to claim 9, wherein
a thickness of one or each of the two electrodes is between 10 nm and 100 nm.

11. An apparatus comprising
a plurality of electrical memristive devices, each electrical memristive device having a layer structure comprising:
two electrodes, and,
connecting the two electrodes, a bilayer material arrangement including:
an HfO$_y$ layer, wherein $1.3\pm0.1 \leq y < 1.9\pm0.1$; and
a WO$_x$ layer in direct contact with the HfO$_y$ layer, wherein $2.5\pm0.1 \leq x < 2.9\pm0.1$, and wherein the WO$_x$ layer has a polycrystalline structure in a monoclinic phase;

an input circuit connected to the electrical memristive devices, so as to be able to operate the latter, in operation; and
a readout circuit connected to the devices, the readout circuit configured to sense electrical signals impacted by electrical conductances of the electrical memristive devices, in operation.

12. The apparatus according to claim 11, wherein
the apparatus is configured as an artificial neural network hardware having a crossbar array structure that includes input lines and output lines, and
the input lines and the output lines of the crossbar array structure are interconnected at junctions, each including one of the electrical memristive devices, the latter configured as synaptic elements of the artificial neural network hardware.

13. A method of fabricating an electrical memristive device, the method comprising
providing a substrate; and
obtaining
a first electrode extending on top of the substrate, in electrical contact therewith;
an HfO$_y$ layer extending on top of the first electrode, in electrical communication therewith, where $1.3\pm0.1 \leq y < 1.9\pm0.1$;
a WO$_x$ layer in direct contact with the HfO$_y$ layer, where $2.5\pm0.1 \leq x < 2.9\pm0.1$, and where the WO$_x$ layer has a polycrystalline structure in a monoclinic phase; and
a second electrode extending on top of the WO$_x$ layer, so as for the second electrode to be in electrical communication with the WO$_x$ layer.

14. The method according to claim 13, wherein
each of the first electrode layer and the HfO$_y$ layer is obtained by atomic layer deposition, the HfO$_y$ layer being deposited subsequently to the first electrode layer, without exposing the first electrode layer to air.

15. The method according to claim 14, wherein the WO$_x$ layer is obtained by
sputtering tungsten in vacuum to obtain a layer of tungsten;
oxidizing the layer of tungsten at a temperature between 300 C and 450 C to obtain a WO$_3$ layer; and
reducing the WO$_3$ layer obtained to obtain the WO$_x$ layer.

16. The method according to claim 15, wherein
the layer of tungsten deposited has a thickness of 7 nm; and
the temperature and the duration for oxidizing the layer of tungsten are chosen so as to obtain a WO$_3$ layer having a thickness of 23 nm.

17. The method according to claim 16, wherein
said temperature is a temperature of crystallization of WO$_3$ in the WO$_3$ layer.

18. The method according to claim 13, wherein
the second electrode is obtained as a TiN electrode by sputtering.

19. The method according to claim 18, wherein the method further comprises:
cladding the TiN electrode with SiO$_2$; and
obtaining a tungsten electrical contact in direct contact with the TiN electrode by sputter deposition.

* * * * *